United States Patent
Sunayama et al.

(10) Patent No.: US 7,803,642 B2
(45) Date of Patent: Sep. 28, 2010

(54) EVALUATION METHOD OF SEMICONDUCTOR DEVICE

(75) Inventors: Michie Sunayama, Kawasaki (JP); Noriyoshi Shimizu, Kawasaki (JP); Masaki Haneda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/548,851

(22) Filed: Aug. 27, 2009

(65) Prior Publication Data

US 2009/0317925 A1 Dec. 24, 2009

Related U.S. Application Data

(63) Continuation of application No. PCT/JP2007/054192, filed on Mar. 5, 2007.

(51) Int. Cl.
*G01R 31/26* (2006.01)
(52) U.S. Cl. .......................................... 438/17; 438/14
(58) Field of Classification Search .................. 438/17, 438/14, 18, 660, 663, 687
See application file for complete search history.

(56) References Cited

U.S. PATENT DOCUMENTS

| | | | |
|---|---|---|---|
| 6,123,825 | A | 9/2000 | Uzoh et al. |
| 6,268,291 | B1 | 7/2001 | Andricacos et al. |
| 6,572,982 | B1 | 6/2003 | Uzoh et al. |
| 2002/0115292 | A1 | 8/2002 | Andricacos et al. |
| 2005/0272258 | A1 | 12/2005 | Morita et al. |
| 2006/0012046 | A1 | 1/2006 | Koura et al. |
| 2006/0113685 | A1 | 6/2006 | Ueki et al. |
| 2007/0161242 | A1 | 7/2007 | Koura et al. |

FOREIGN PATENT DOCUMENTS

| | | |
|---|---|---|
| JP | 2000-174025 A | 6/2000 |
| JP | 2004-158897 A | 6/2004 |
| JP | 2004-342977 A | 12/2004 |
| JP | 2006-019708 A | 1/2006 |
| JP | 2006-032545 A | 2/2006 |
| JP | 2006-040908 A | 2/2006 |
| JP | 2006-294922 A | 10/2006 |
| WO | 2004-053971 A1 | 6/2004 |

OTHER PUBLICATIONS

International Search Report of PCT/JP2007/054192, Mailing Date of May 15, 2007.
H. Shih et al. "Design of ECP Additive for 65 nm-node Technology Cu BEOL Reliability," International Interconnect Technology Conference, Jun. 6-8, 2005.
B. Alers, et al. "Influence of Copper Purity on Microstructure and Electromigration." International Interconnect Technology Conferene Jun. 7-9, 2004.
Notification of Transmittal of Translation of the International Preliminary Report on Patentability (form PCT/IB/338) of International Application No. PCT/JP2007/054192 mailed Sep. 17, 2009 with Forms PCT/IB/373 and PCT/ISA/237.

*Primary Examiner*—Charles D Garber
*Assistant Examiner*—Reema Patel
(74) *Attorney, Agent, or Firm*—Westerman, Hattori, Daniels & Adrian, LLP

(57) ABSTRACT

A technology for analyzing and evaluating of a change of impurity content distribution at the heat treatment of electrodeposited copper film. There is provided a method of evaluating a semiconductor device, comprising providing an electrodeposited copper film formed while causing the deposition current to transit between the first state of current density and the second state of current density so as to attain a desired impurity content distribution and carrying out analysis and evaluation of any impurity diffusion from a change of impurity content distribution in the electrodeposited copper film between before and after heat treatment.

17 Claims, 6 Drawing Sheets

EVALUATION METHOD OF SEMICONDUCTOR DEVICE

CROSS-REFERENCE TO RELATED APPLICATIONS

This is a continuation of Application PCT/JP2007/054192, filed on Mar. 5, 2007, now pending, the contents of which are herein wholly incorporated by reference.

FIELD

The embodiments discussed herein are relates to an evaluation method of a semiconductor device.

BACKGROUND

Over the recent years, copper wiring has been adopted as a wiring material for CMOS LSI (Complementary Metal Oxide Semiconductor Large Scale Integration) in terms of reducing wiring resistance and enhancing durability of electro migration (EM) and stress migration (SIV: Stress Induced Voiding).

Copper (Cu) is hard to work the wiring by dry etching unlike aluminum (Al) that has hitherto been employed. Such being the case, formation of the copper wiring generally involves adopting a damascene method of forming a trench becoming the wiring and a via becoming a contact in an insulating film and forming the wiring by embedding the copper therein, and a dual damascene method of forming the trenches becoming the wiring and the via and integrally forming the wiring and a plug by embedding the copper therein. Generally the copper layer is electrodeposited onto a substrate in terms of mass productivity and costs.

The electrodeposited copper film based on the damascene method is mixed with impurities such as oxygen (O), carbon (C), sulfur (S), chlorine (Cl) and nitrogen (N), and it is known that the in-wiring impurities affect the durability of the EM, the SIV, etc (refer to, e.g., Non-Patent documents 1 and 2).

In a copper wiring forming process of a general type of Cu/Ta(N) wiring structure, the EM and the SIV are in a trade-off relationship. Namely, if a wiring width is narrow, a problem about the durability against the EM arises but is solved by decreasing a concentration of the impurity. Whereas if the wiring width is wide, a problem about the durability against the SIV arises but is solved by increasing the concentration of the impurity.

Accordingly, when forming the copper wiring, it is desirable to adjust the concentration of the impurity corresponding to the wiring width. Further, the impurity in the electrodeposited copper film is thermally diffused in an annealing process after the electrodeposition, and it is therefore necessary to adjust the concentration of the impurity, including a behavior of the diffusion.

Note that Patent document 1 discusses a technology of forming the copper wiring exhibiting the high durability against the EM by electrodeposited copper composition containing the impurity and diffusing the impurity within a copper seed layer after growing the copper seed layer.

Moreover, Patent document 2 discusses a technology of decreasing the impurity concentration of the grown copper electrodeposited film by taking a wafer out of a plating solution in a state of applying a voltage.

Further, Patent document 3 discusses a technology of forming the copper film exhibiting the high durability against the EM by staking the impurities.

The following are examples of related art of the present invention: Influence of Copper Purity on Microstructure and Electromigration, B. Alers, et al. (IEEE 2004), Design of ECP Additive for 65 nm-node Technology Cu BEOL Reliability, H. Shih, et al., (ITC 2005), Japanese Patent Laid-Open Publication No. 2004-158897, Japanese Patent Laid-Open Publication No. 2006-40908, Japanese Patent Laid-Open Publication No. 2000-174025, and Japanese Patent Laid-Open Publication No. 2006-32545.

SUMMARY

An evaluation method of a semiconductor device, include manufacturing a semiconductor device defined as a sample with a copper electrodeposited film grown on a semiconductor substrate, and growing said copper electrodeposited film on said semiconductor substrate by causing a flow of an electric current having an application pattern which transitions to a state of a first current density in which a per-unit-area current density of a deposition current flowing on said semiconductor substrate is a predetermined current density and to a state of a second current density defined as a current density different from the first current density so that a distribution of an impurity concentration in said grown copper electrodeposited film becomes a desired concentration distribution; analyzing said semiconductor device manufactured and acquiring a distribution of the concentration of the impurity contained in said copper electrodeposited film of said semiconductor device; thermal treating said semiconductor device, analyzing said semiconductor device thermal treated and acquiring a distribution of the concentration of the impurity contained in said copper electrodeposited film of said semiconductor device, and comparing the distribution of the impurity concentration acquired by analyzing said semiconductor device before thermal treating with the distribution of the impurity concentration acquired by analyzing said semiconductor device after thermal treating, and analyzing the impurity diffusion on the occasion of the thermal treatment.

The object and advantage of the embodiment will be realized and attained by means of the elements and combinations particularly pointed out in the claims.

It is to be understood that both the foregoing general description and the following detailed description are exemplary and explanatory only and are not restrictive of the invention, as claimed.

DESCRIPTION OF EMBODIMENTS

An evaluation method of a semiconductor device according to a preferred embodiment of the present disclosure will hereinafter be described with reference to the drawings. The embodiment is an exemplification, and the present disclosure is not limited to this configuration.

<Evaluation Method>

Figure 1:
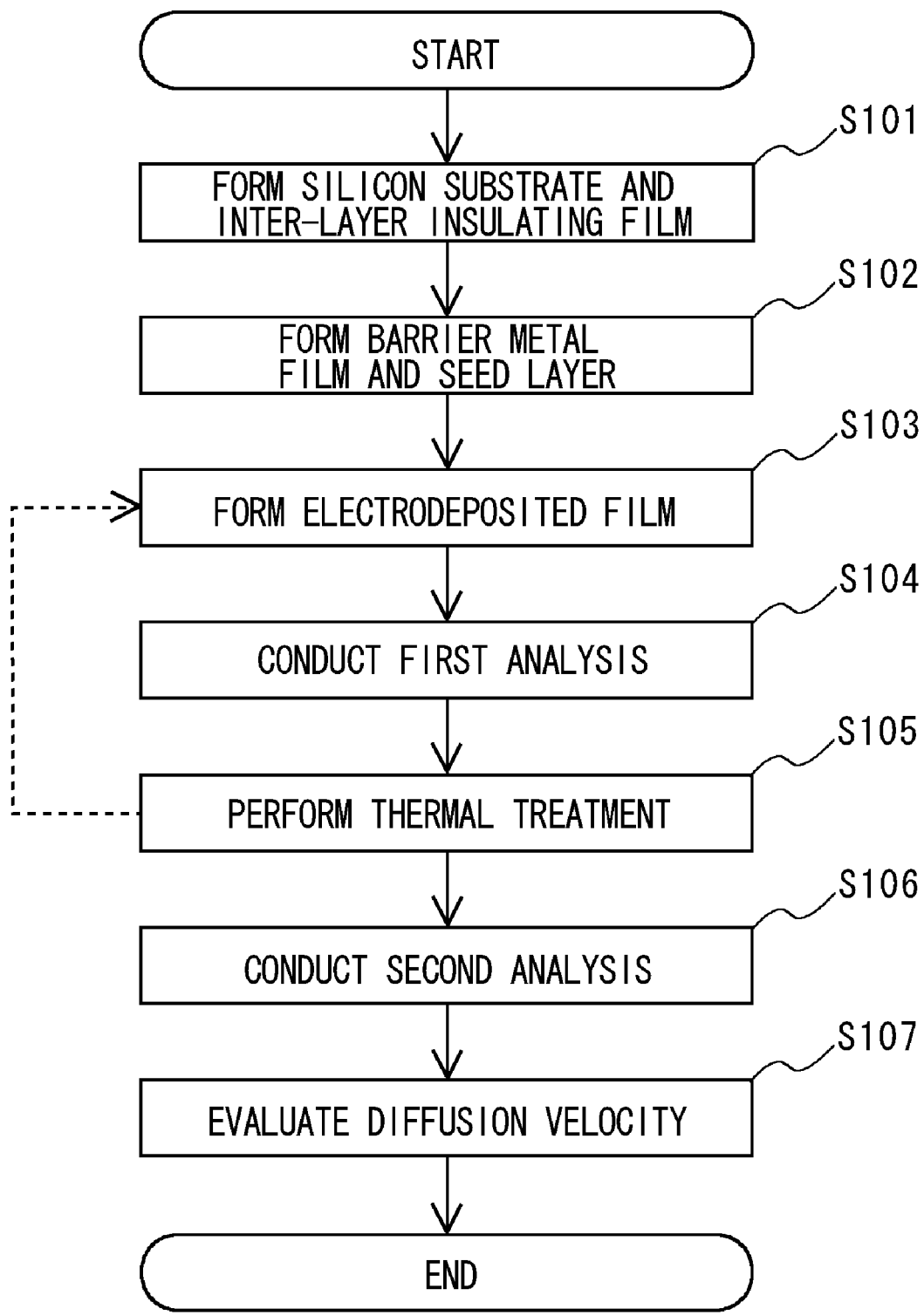
FIG. 1 is a flowchart illustrating a flow of evaluation method of a semiconductor device.

An outline of the evaluation method of a semiconductor device in one embodiment of the present disclosure will hereinafter be discussed. FIG. 1 is a flowchart illustrating a flow of the evaluation method of the semiconductor device. The evaluation method of the semiconductor device according to the embodiment will hereinafter be described with reference to the flowchart illustrated in FIG. 1.

Figure 2:
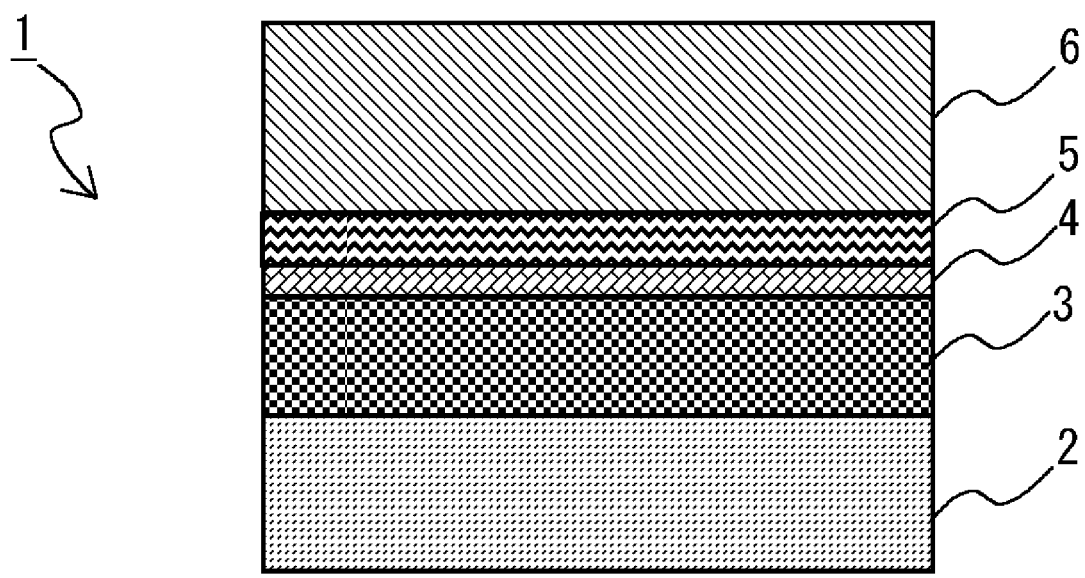
FIG. 2 is a sectional view of a sample (semiconductor device)

As illustrated in the flowchart of FIG. 1, in the evaluation method of the semiconductor device, at first, a sample required for evaluating the semiconductor device is produced (steps S101-S103). Next, a concentration distribution of an impurity contained in a copper electrodeposited film of the produced sample is examined (step S104). Subsequently, the produced sample is subjected to a thermal treatment, thereby diffusing the impurity (step S105). Next, the distribution of the impurity concentration in the copper electrodeposited film of the sample is examined (step S106). Subsequently, a distribution of the impurity concentration before the thermal treatment is compared with a distribution of the impurity concentration after the thermal treatment, thus evaluating the semiconductor device (step S107). Note that the evaluation of the semiconductor device in the disclosure of the present application connotes acquisition of a volume diffusion coefficient (Dv), an apparent diffusion coefficient (D), an average diffusion distance of grain boundary diffusion, an average reflection count on a Ta interface (a barrier metal film) based on the grain boundary diffusion, an interface adsorption ratio k and a contribution degree s of the grain boundary diffusion with respect to a total diffusion quantity of an electrodeposited copper film. Hence, in step S107, the impurity diffusion is simulated based on the distribution of the impurity concentration before the thermal treatment, and fitting is conducted in a way that compares a simulation result with an actual measurement value of the distribution of the impurity concentration after the thermal treatment. Values of the respective coefficients (the diffusion coefficient etc) in the simulation formula are determined so that a graph of the simulation result becomes coincident with a graph of the actual measurement value, thereby acquiring the volume diffusion coefficient etc. Note that FIG. 2 is a sectional view of a sample 1 (corresponding to a [semiconductor device] according to the present disclosure) produced in steps S101 through S103.

<Flow of Evaluation Method>

(Step S101) To begin with, an inter-layer insulating film 3 is grown on a semiconductor substrate 2 as a silicon substrate. The inter-layer insulating film 3 is grown to a thickness on the order of, e.g., 100 nm.

(Step S102) Next, a barrier metal film 4 and a seed layer 5 are formed by a sputtering method or a CVD (Chemical Vapor Deposition) method on the inter-layer insulating film 3 grown in step S101. The barrier metal film 4 restrains the metal from diffusing into the inter-layer insulating film 3. Further, the seed layer 5 is an electrode for causing a flow of an electric current on the occasion of performing the electrodeposition. The barrier metal film 4 may consist of a refractory metal such as Ta, Ti, W and V and a monolayer film of a nitride of one of these refractory metals, and may also consist of a stacked-layer film built up by combining the refractory metals and the nitrides of these refractory metals. The seed layer 5 may be composed of, in addition to a conductive material such as Cu that is generally broadly used as a seed for the copper electrodeposition, a conductive material of a Cu compound containing a metal such as Al, Ti, Zr, Ni, Ag and Pd. The barrier metal film 4 is grown to a thickness on the order of 30 nm.

(Step S103) Next, the electrodeposited copper film 6 is grown on the copper seed layer 5 grown in step S102. The copper film 6 is grown by an electrodeposition. A plating solution used for the electrodeposition is copper sulfate and involves using the copper sulfate containing predetermined quantities of copper ion and chloride ion, and, as additives, an accelerator, a suppressor, a leveler, etc. In the embodiment, Viaform (registered trademark) Low Acid of Enthone Inc., which contains the accelerator of 6 ml/L, the suppressor of 2 mol/L and the leveler of 4 ml/L, is employed as the plating solution. Incidentally, NExTTM Generation Viaform of Enthone Inc. may also be used.

Dipping of the semiconductor substrate 2 in the plating solution may adopt a hot entry method (which is a method of starting the dipping in a state of applying a voltage to between the semiconductor substrate 2 defined as a cathode and the electrode defined as an anode in the plating solution) and may also adopt a cold entry method (which is a method of applying the voltage to between the cathode and the anode after the dipping). Further, other available methods are a ramped entry method (which is a method of dipping while the applied voltage is changed in a ramped shape), a potentiostatic entry method (which is a method of dipping while the applied voltage is changed in proportion to a dipping area of a wafer) and a triggered entry method (which is a method of starting the dipping in a state of applying a low applied voltage and applying a high applied voltage when the dipping is completed).

Figure 3:
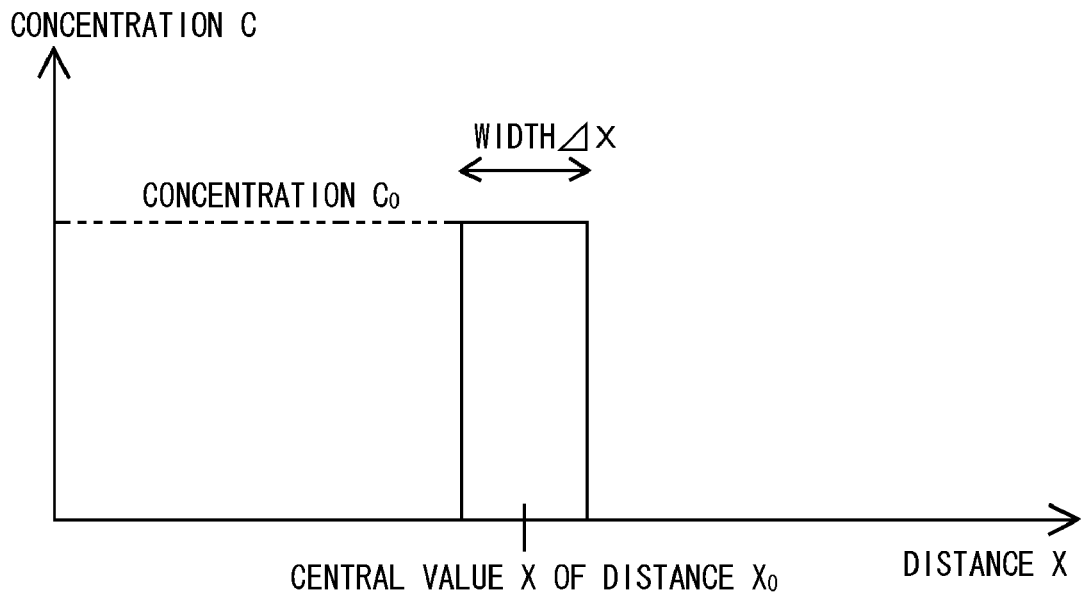
FIG. 3 is a conceptual diagram illustrating a state of impurity diffusion due to a thermal treatment.
Figure 3:
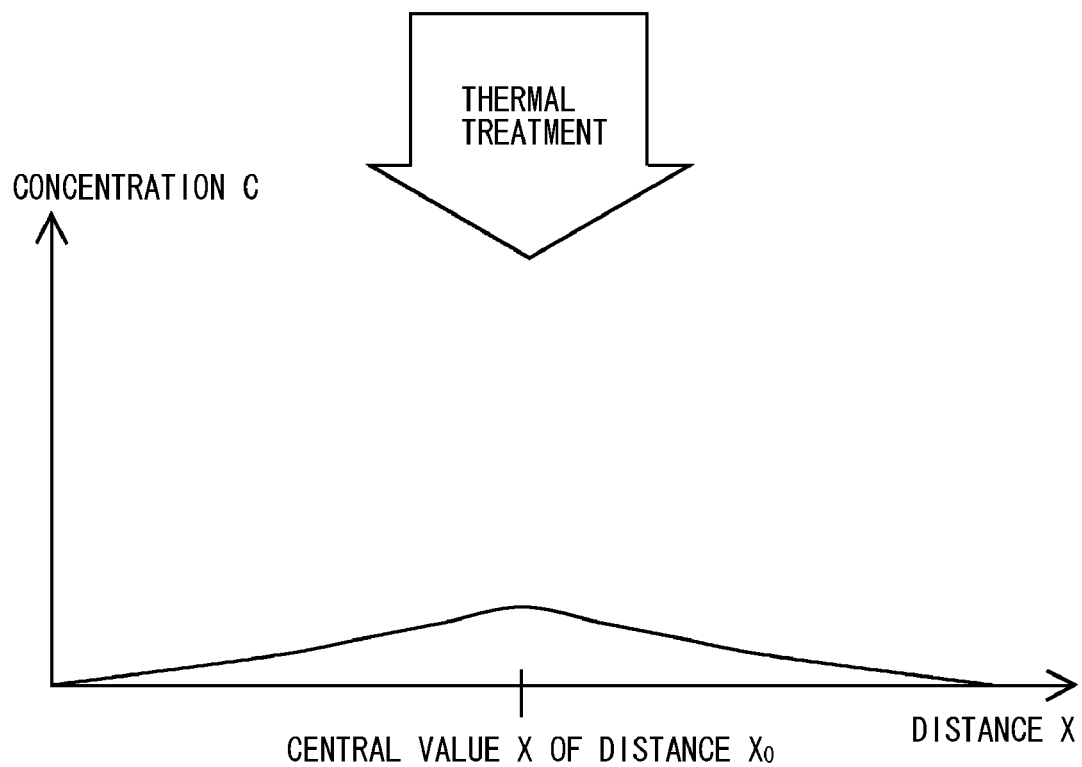

Herein, it is desirable for analyzing the diffusion of the impurity during the electrodeposition when the semiconductor substrate 2 undergoes the thermal treatment that the distribution of the impurity concentration in the electrodeposited copper film largely changes before and after the thermal treatment and that the change in the distribution of the impurity concentration due to the diffusion conspicuously occurs. Normally, when electrodeposited copper film is thermally treated, the distribution of the impurity concentration in the electrodeposited copper film becomes leveled off stepwise. Hence, if the distribution of the impurity concentration of the electrodeposited copper film before the thermal treatment comes to a state approximate to the flatness, the distribution of the impurity concentration after the thermal treatment does not change so much, with the result that a behavior of the diffusion of the impurity can not be analyzed. Accordingly, with respect to the sample before the thermal treatment, it is desirable that there is a scatter in the distribution of the impurity concentration of the electrodeposited copper film 6. FIG. 3 is a conceptual diagram illustrating a state of how the impurity is diffused by the thermal treatment. As depicted in FIG. 3, if there is the scatter in the distribution of the impurity concentration of the electrodeposited copper film before the thermal treatment, a difference form the distribution of the impurity concentration of the electrodeposited copper film after the thermal treatment conspicuously occurs.

Such being the case, when the electrodeposited copper film 6 is grown, the applied voltage of the electrodeposition is changed. This is because, if changing the applied voltage of the electrodeposition when growing the film, the impurity concentration of the formed copper electrodeposited film becomes higher than in the case of growing the film with a fixed applied voltage. On the occasion of performing the electrodeposition, the applied voltage is changed, e.g., periodically so that a current density of the deposition current per unit area changes at least two or more stages. With the change of the applied voltage, the copper electrodeposited film having the scatter in the distribution of the impurity concentration is grown, in which a region exhibiting the high impurity concentration and a region exhibiting the low impurity concentration are intermingled. The current density is arbitrarily determined corresponding to a film growth velocity and a characteristic of the plating solution, the [predetermined current density] connoted according to the present disclosure is a per-unit-area density of the deposition current suitable for growing the electrolytic copper electrodeposited film and is, e.g., the current density that is arbitrarily determined by an operator who produces the sample. Note that plural types of current densities set up stepwise are called a first current density, a second current density and a third current density, respectively in the present application.

For producing the sample suited to the analysis of the diffusion of the impurity in the electrodeposited copper film, it is desirable that the second current density be at least twice or more times as high as the first current density and more preferably be five or more times the first current density. With this setting, the scatter occurs in the impurity concentration of the electrodeposited copper film, which enables the sample suited to the analysis of the impurity diffusion to be produced.

On the occasion of growing the electrodeposited copper film, the current density may be changed simply at two stages of the first current density and the second current density and may also be changed at three stages with a further addition of the third current density. In this case, it is desirable that the third current density be at least twice or more times the second current density and more preferably be five or more times the second current density. Further, the third current density may be at least equal to or smaller than one-half the second current density and more preferably equal to or smaller than one-fifth the second current density. With this setting, the scatter in the impurity concentration of the electrodeposited copper film becomes conspicuous, whereby the sample more suited to the analysis of the impurity diffusion can be produced. Herein, the [desired distribution of the concentration] connoted according to the present disclosure is a distribution of the impurity concentration that is suited to the analysis of the impurity diffusion of the electrodeposited copper film and is, e.g., a distribution of the concentration of such a type that a peak occurs in the impurity concentration of the electrodeposited copper film so that the change in the distribution of the impurity concentrations before and after the thermal treatment becomes conspicuous.

Note that the electrodeposited copper film 6 according to the embodiment is grown by causing a flow of the electric current of 1 A (corresponding to one example of the [first current density] according to the present disclosure) for 10 sec and a flow of the electric current of 3 A (corresponding to one example of the [second current density] according to the present disclosure) for 30 sec and a flow of the electric current of 8 A (corresponding to one example of the [third current density] according to the present disclosure) till the thickness of the electrodeposited copper film 6 reaches 60 nm. Further, at least two or more samples 1 grown under the same conditions are produced for comparing the distribution of the impurity concentration of the sample before the thermal treatment with the distribution of the impurity concentration after the thermal treatment.

It should be noted that step S103 corresponds to a [semiconductor device manufacturing step] according to the present disclosure.

(Step S104) Next, with respect to one of the produced samples 1, the depthwise distribution of the concentrations of the impurities (e.g., sulfate (S), chlorine (Cl), oxygen (O), carbon (C) and nitrogen (N)) of the electrodeposited copper film 6 is examined (corresponding to a [first impurity concentration analyzing step] according to the present disclosure). The distribution of the impurity concentration is examined by, e.g., SIMS (Secondary Ion Mass Spectrometry) and Backside SIMS. Note that when analyzed by the SIMS, the surface of the electrodeposited copper film 6 is flattened by a CMP (Chemical Mechanical Polishing) process with the result that an extra copper plated film and an extra barrier metal film are removed as the necessity may arise.

Figure 4:
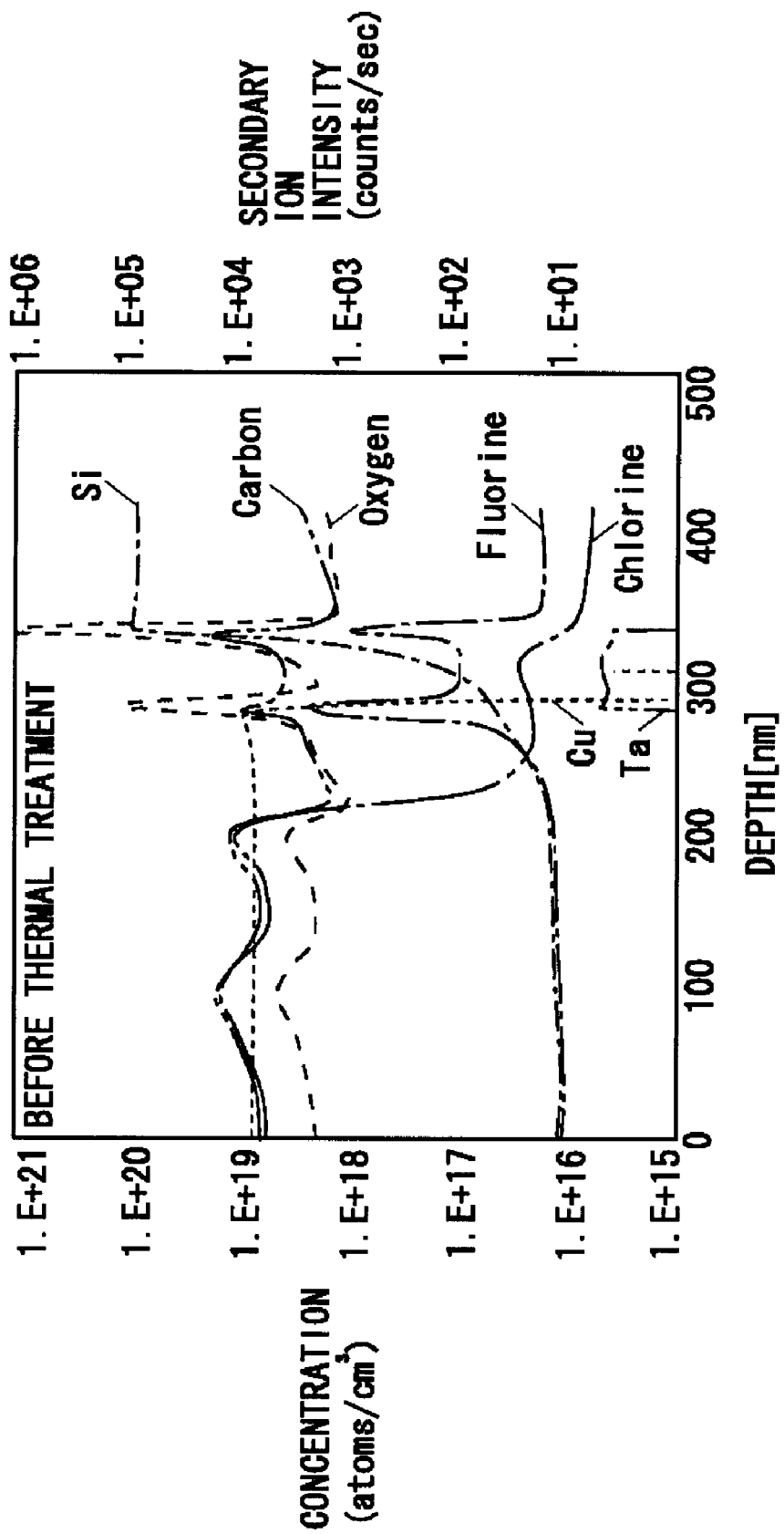
FIG. 4 is a graph illustrating a distribution of the impurity concentration before the thermal treatment.

FIG. 4 is a graph illustrating the distribution of the impurity concentration of the sample 1, which is examined by the SIMS. In the graph of FIG. 4, an area shallower than about 280 nm in depth is a region of the electrodeposited copper film 6, and an area deeper than about 280 nm in depth is a region of the barrier metal film 4. Note that if the distribution of the impurity concentration of the produced sample 1 proves to be flat in step S104, the operation loops back to step S103, in which the electrodeposited copper film 6 is again formed, or alternatively the sample 1 is produced from a new semiconductor substrate 2.

Note that the surface is cut off by sputtering the surface with irradiation of the ions according to the SIMS. Then, trajectories of the positive-ionized elements on the thus-sputtered surface are controlled by electromagnetic force, and the ionized elements are introduced into and separated by a detector on an ion-type basis, thereby detecting the concentration distribution. An absolute concentration is obtained by calibration based on a comparison between the known sample and an analyzed result of an analyzing device. A component ratio, i.e., a concentration ratio of the impurities in the sample can be thereby acquired. Further, each impurity concentration itself can be measured from a relationship between the measurement result of the impurity concentration of the known sample or the measurement result of the impurity concentration by another analyzing device and the measurement result of the impurity concentration in the sample 1.

(Step S105) Subsequently, another sample 1 undergoing one of mass analyses is subjected to the thermal treatment (annealing) (corresponding to a [thermal treatment step] according to the present disclosure). A thermal treatment condition is not particularly restricted, however, if the thermal treatment is conducted at a temperature of, e.g., 150° C. or higher, the impurities in the electrodeposited copper film 6 contained in the electrodeposited copper film 6 are diffused with high efficiency, whereby the sample 1 suited to the analysis is produced. Note that the sample 1 is subjected to the thermal treatment at a temperature of 350° C. for 90 sec. Through this thermal treatment, the impurities in the electrodeposited copper film get diffused, and the scatter in the distribution of the impurity concentration is reduced down to the flatness.

(Step S106) Next, with respect to the thermally-treated sample 1, the depthwise distribution of the impurity concentration of the electrodeposited copper film 6 is examined (corresponding to a [second impurity concentration analyzing step] according to the present disclosure). The distribution of the impurity concentration is analyzed by the SIMS etc in the same way as step S104.

Figure 5:
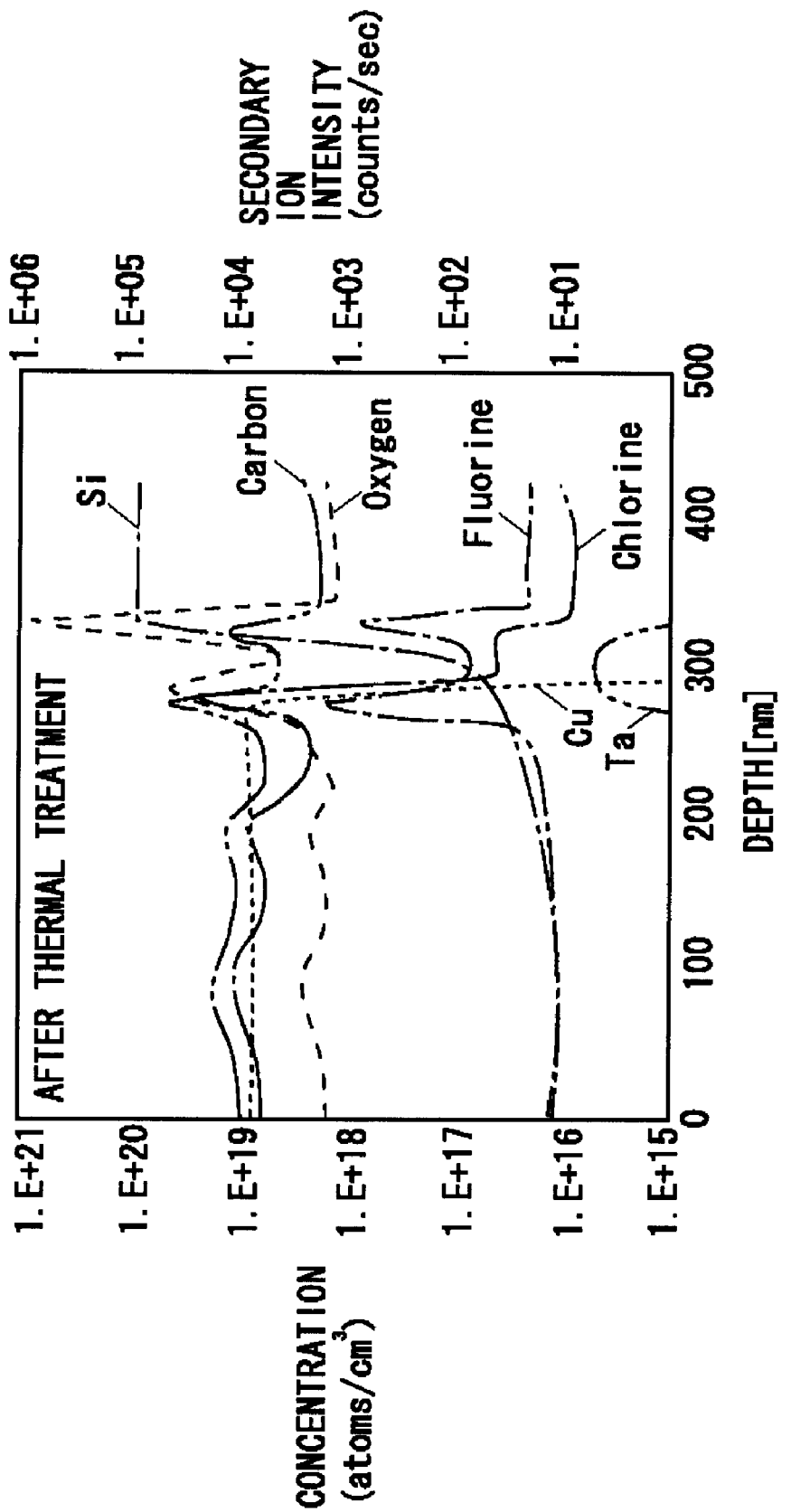
FIG. 5 is a graph illustrating the distribution of the impurity concentration after the thermal treatment.

FIG. 5 is a graph illustrating the distribution of the impurity concentration of the sample 1 after the thermal treatment, which has been examined by the SIMS. As compared with the distribution of the impurity concentration of the sample 1 before the thermal treatment depicted in FIG. 4, it is recognized that the scatter in the distribution of the impurity concentration of the area (i.e., specified by the depth ranging from 0 nm to 280 nm) of the electrodeposited copper film 6 is reduced down to the flatness.

(Step S107) Subsequently, in the following procedures, the distribution of the impurity concentration of the sample 1 before the thermal treatment, which is acquired in step S104, is compared with the distribution of the impurity concentration of the sample 1 after the thermal treatment, which is acquired in step S106, thereby analyzing the impurity diffusion on the occasion of the thermal treatment (corresponding to a [diffusion analyzing step] according to the present disclosure). Hereafter, the apparent diffusion coefficient is obtained in step S107-1; the volume diffusion coefficient, the interface adsorption ratio and the contribution degree to the total diffusion quantity are obtained in step S107-2; and the average diffusion distance through the grain boundary diffusion is obtained in step S107-3.

(Step S107-1) (Apparent Diffusion Coefficient Determining Step) To begin with, the apparent diffusion coefficient (D) is obtained in the following procedures. Let D be an apparent diffusion coefficient, $C_0$ be a concentration of the impurity before the thermal treatment, t be a period of thermal treatment time, x be a depth of the electrodeposited copper film 6 from the surface, $\Delta x$ be an interval between sampling points in the SIMS, and x0 be a distance of the sampling point in the SIMS from the surface of the electrodeposited copper film 6.

A change in the distribution of the impurity concentration after the thermal treatment can be simulated in the following formula.

$$C(x, t) = \frac{C_0 \Delta x}{2\sqrt{\pi D t}} \exp\left(-\frac{(x-x_0)^2}{4Dt}\right) \quad \text{[Mathematical Expression 1]}$$

Accordingly, the impurity concentration (the impurity concentration examined in step S104) of the electrodeposited copper film 6 before the thermal treatment, which is examined by the SIMS, is calculated in a way that substitutes this impurity concentration into the Mathematical Expression 1, and values of the respective coefficients in the Mathematical Expression 1 are determined so that a plotted graph becomes approximately coincident with the distribution of the impurity concentration (the graph of the impurity concentration examined in step S106) of the electrodeposited copper film 6 after the thermal treatment, which is examined by the SIMS.

Thus, the predetermined values of the respective coefficients in the simulation formula are sequentially substituted (in the case of the simulation performed by a computer, for example, arbitrary intervals Dmin–Dmax are determined, and a value determined by Dmin+$\Delta$D×k (k=1, 2, 3, . . . n) is sequentially substituted), and such coefficients in the simulation formula are obtained and determined that the distribution of the impurity concentration after the actual thermal treatment becomes approximately coincident with the distribution of the impurity concentration that is plotted in the simulation formula, which process is referred to as "fitting" in the present application.

In the embodiment, the impurity concentration C0 before the thermal treatment is the impurity concentration at each sampling point and is the value (the impurity concentration in each depth) indicated by the graph illustrated in FIG. 4 given above. Further, the distance x0 is the distance from the surface of the electrodeposited copper film 6 to a central position between the sampling points neighboring to each other, and is a value on the axis of abscissa of the graph illustrated in FIG. 4 given above. Moreover, the thermal treatment time t is, as described above, on the order of 90 sec. Further, the interval $\Delta x$ between the sampling points in the SIMS is determined based on a resolution of a SIMS apparatus and is on the order of $1.3 \times 10^{-9}$ m. One other value, i.e., the apparent diffusion coefficient D is an unknown.

Such being the case, the predetermined values are sequentially substituted into D in the Mathematical Expression 1. Each time the predetermined value is substituted, the graph illustrating a relationship between the depth x and the impurity concentration C is plotted, and the apparent diffusion coefficient D, at which the plotted graph becomes coincident with the distribution of the impurity concentration of the actual measurement values after the thermal treatment depicted in FIG. 5, is sought (fitting).

Figure 6:
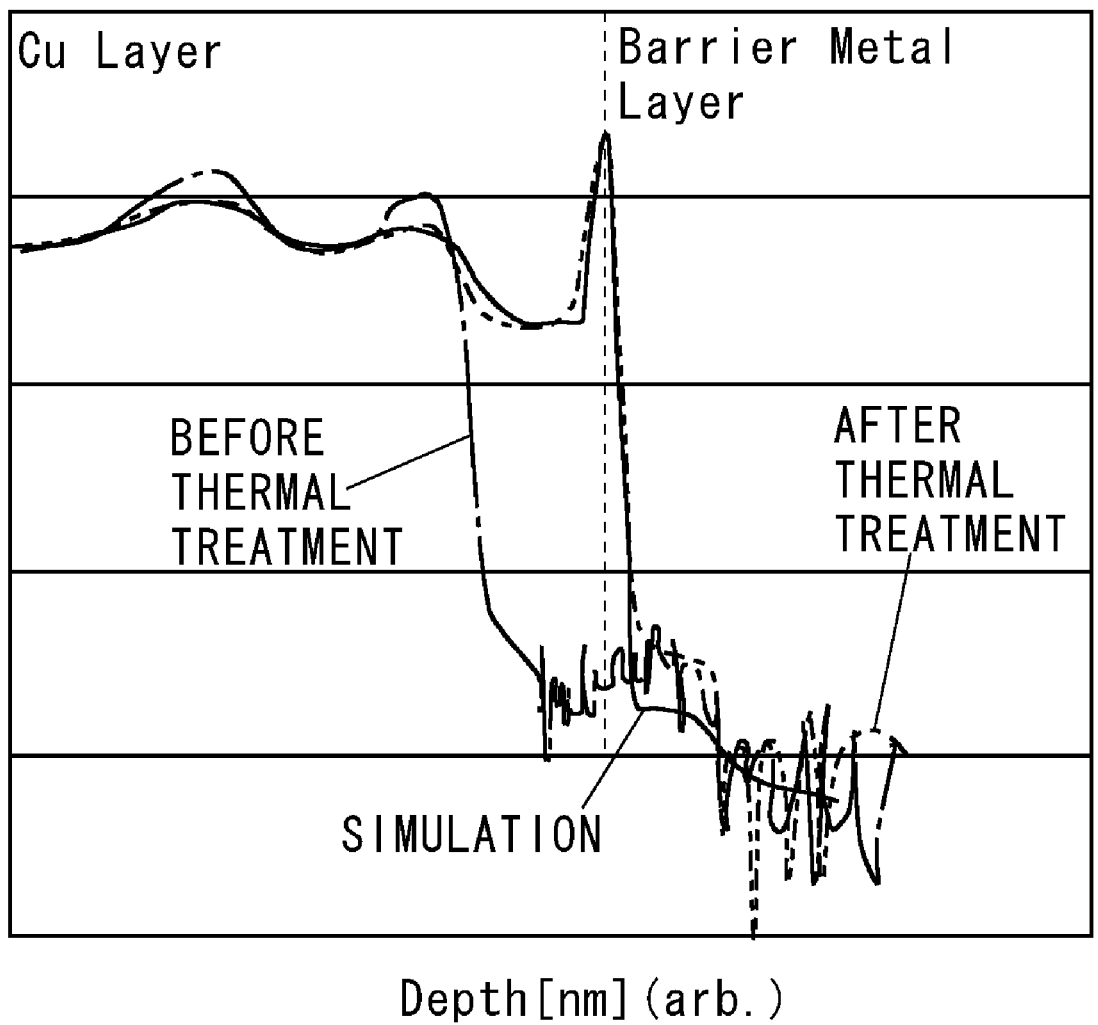
FIG. 6 is a graph illustrating a comparison between an actual measurement value of the impurity concentration and a result of simulation.

In the embodiment, as a result of conducting the fitting, the apparent diffusion coefficient D is given such as $1.0 \times 10^{-18}$ with respect to the carbon (C), $6.3 \times 10^{-19}$ with respect to the oxygen (O) and $6.4 \times 10^{-19}$ with respect to the chlorine (Cl), in which case the graph given in the simulation formula becomes approximately coincident with the graph of the distribution of the impurity concentration examined in step S106. FIG. 6 illustrates the distribution of the impurity concentration before the thermal treatment, the distribution of the impurity concentration after the thermal treatment and the distribution of the impurity concentration in simulation. As depicted in FIG. 6, a scheme is done so that the graph plotted in the simulation formula becomes approximately coincident with the graph of the actual measurement value of the impurity concentration after the thermal treatment.

(S107-2) (Step of Determining Volume Diffusion Coefficient, Interface Adsorption Ratio and Contribution Degree to Total Diffusion Quantity) Next, the volume diffusion coefficient (Dv), the interface adsorption ratio k and the contribution degree s to the total diffusion quantity are obtained in the following procedures.

The distribution of the impurity concentration after the thermal treatment changes according as the simulation formula given in the Mathematical Expression 1 indicates, however, the Mathematical Expression 1 is factorized as follows.

$$\therefore C(x, t) = g(x, t) + J \cdot L \cdot h(x, t) + \frac{\Delta \alpha_{int}}{2\sqrt{\pi K t}} \quad \text{[Mathematical Expression 2]}$$

$$\left[\frac{\left(\sum_{i=1}^{m} c_i \Delta \alpha_i\right) - }{\int_0^{\alpha_{int}} g(x, t) + J \cdot L \cdot h(x, t) dx}\right]$$

$$\exp\left(-\frac{(x-\alpha_{int})^2}{4Kt}\right)$$

Herein, g (x, t) is a monadic expression which simulates the impurity diffusion by way of the volume diffusion and is expressed by the following mathematical expression.

$$g(x, t) = \frac{1-s}{2\sqrt{\pi D_v t}} \quad \text{[Mathematical Expression 3]}$$

$$\left[\begin{array}{l}\left(\sum_{i=1}^{n} c_i \Delta \alpha_i \exp \left(-\frac{(x-\alpha_i)^2 +}{4 D_v t}\right)\right) + \\ (1-k)\left(\sum_{i=1}^{m} c_i \Delta \alpha_i \exp \left(-\frac{(x-(2\alpha_{int}-\alpha_i))^2}{4 D_v t}\right)\right)\end{array}\right]$$

Furthermore, h(x, t) is a monadic expression which simulates the impurity diffusion by way of the grain boundary diffusion and is expressed by the following mathematical expression.

$$h(x, t) = \frac{s}{2\sqrt{\pi D_{gb} t}}$$ [Mathematical Expression 4]

$$\left[\begin{pmatrix} \sum_{i=1}^{m} c_i \Delta \alpha_i \exp \\ \left(-\frac{(x-\alpha_i)^2 +}{4D_{gb}t} \\ \frac{(x-(-\alpha_i))^2}{4D_{gb}t}\right) \end{pmatrix} + (1-k)\begin{pmatrix} \sum_{i=1}^{m} c_i \Delta \alpha_i \exp \\ \left(-\frac{(x-(2\alpha_{int}-\alpha_i))^2}{4D_{gb}t}\right) \end{pmatrix}\right] \approx const.$$

Note that a grain boundary diffusion coefficient $D_{gb}$ is extremely large as compared with the volume diffusion coefficient $D_v$. This is because the impurity diffuses through the grain boundary between the crystal grains faster than within the crystal grains. Hence, h(x, t) can be considered to take a substantially fixed value without depending on a value of $\alpha_i$.

Further, the grain boundary diffusion involves multiple reflections on the surface of the electrodeposited copper film 6 and on the interface. Hence, in the simulation formula of the grain boundary diffusion, h(x, t) is multiplied by J given in the following mathematical expression in order to store the whole quantity.

$$J = \frac{\int_{-\infty}^{+\infty} i(x, t) dx}{3 \int_{0}^{\alpha_{int}} i(x, t) dx},$$ [Mathematical Expression 5]

where:

$$i(x, t) = \frac{1}{2\sqrt{\pi D_{gb} t}} \exp\left(-\frac{(x-\alpha_i)^2}{4D_{gb}t}\right)$$

Note that J·h(x, t) takes, as given as below, a fixed value that is influenced by neither the depth x nor the thermal treatment time t. Incidentally, Cave represents an average concentration of the impurities from the surface to the interface in the following formula.

$$J \cdot h(x, t) = \frac{\sum_{i=1}^{134} c_i \Delta \alpha_i}{\alpha_{int}} = sc_{ave}$$ [Mathematical Expression 6]

Moreover, the interface reflection of the grain boundary diffusion brings about a decrease in diffusion quantity due to the adsorption when reflected. Therefore, in the simulation formula of the grain boundary diffusion, the multiplication of L given in the following mathematical expression is made in a way that takes the decrease in diffusion quantity due to the adsorption into consideration.

$$L = (1-k)^{\frac{\sqrt{2D_{gb}t}}{2\alpha_{int}}}$$ [Mathematical Expression 7]

Note that $$\frac{\sqrt{2D_{gb}t}}{2\alpha_{int}}$$

in the Mathematical Expression 7 is given as below.

$$\frac{\sqrt{2D_{gb}t}}{2\alpha_{int}}$$ [Mathematical Expression 8]

$$\frac{\sqrt{2D_{gb}t}}{2\alpha_{int}}$$

is an average collision count when the grain boundary diffusion atoms collide with the interface.

As discussed above, C(x, t), which is a monadic expression of the diffusion simulation of the apparent concentration distribution, is an expression into which the simulation formula of the volume diffusion is combined with the simulation formula of the grain boundary diffusion, and is organized by the coefficients such as s (the contribution degree to the total diffusion quantity), $D_v$ (the volume diffusion coefficient), n (the total plotting point count before the thermal treatment), $\Delta\alpha_i$ (the width between the plotting points), $\alpha_i$ (the distance from the surface to each plotting point), k (the adsorption probability of the impurity to the barrier metal film 4), m (the plotting point count from the surface of the electrodeposited copper film before the thermal treatment to the barrier metal film 4 (Ta interface)), $\alpha_{int}$ (the distance from the surface to the barrier metal film 4) and $D_{gb}$ (the grain boundary diffusion coefficient).

Herein, in the embodiment, $D_{gb}$ is the value acquired from the document and is given by $6.3\times10^{-13}$ with respect to each of the carbon (C), the oxygen (O) and the chlorine (Cl). The coefficients m, n, $\Delta\alpha_i$ and $\alpha_i$ are the values determined based on the resolution of the SIMS, and αint is the value determined when growing the electrodeposited copper film. Hence, it follows that the unknown coefficients in the Mathematical Expression 2 are s, $D_v$ and k.

Then, the impurity concentration of the electrodeposited copper film 6 before the thermal treatment, which is examined by the SIMS, is calculated in a way that substitutes this impurity concentration into the Mathematical Expression 1, and the predetermined values are sequentially substituted into the respective coefficients (s, $D_v$ and k) so that the plotted graph becomes approximately coincident with the distribution of the impurity concentration of the electrolytic copper plated film 6 after the thermal treatment that is examined by the SIMS (fitting).

In the embodiment, as a result of conducting the fitting, the contribution degree s of the grain boundary diffusion to the total diffusion quantity is 0.42 with respect to the carbon (C) and 0.38 with respect to the oxygen (O) and the chlorine (Cl), in which case the simulation formula becomes approximately coincident with the graph in step S106.

Moreover, the values acquired as the volume diffusion coefficient Dv are $1.0 \times 10^{-19}$ with respect to the carbon (C), $1.0 \times 10^{-19}$ with respect to the oxygen (O) and $2.0 \times 10^{-19}$ with respect to the chlorine (Cl).

Further, the values acquired as the interface adsorption ratio k are 0.005 with respect to the carbon (C), 0 with respect to the oxygen (O) and 0.005 with respect to the chlorine (Cl).

(S107-3) (Step of Determining Average Diffusion Distance through Grain Boundary Diffusion) Subsequently, the average diffusion distance through the grain boundary diffusion is calculated in the following mathematical expression.

$$\text{Average distance } \sqrt{2D_{gb}t} \quad \text{[Mathematical Expression 9]}$$

Note that in the Mathematical Expression 9, the [average distance] is an average distance of the impurities distributed both within the grains and in the grain boundaries of the electrodeposited copper film.

The respective coefficients acquired so far in steps S107-1 through 107-3 are listed in the following table.

TABLE 1

| | C | O | Cl |
|---|---|---|---|
| Volume diffusion coefficient (m$^2$/s) | 1.0E−19 | 1.0E−19 | 2.0E−19 |
| Grain boundary diffusion coefficient (m$^2$/s) | 6.3E−13 | 6.3E−13 | 6.3E−13 |
| Apparent diffusion coefficient (m$^2$/s) in Cu plated film | 1.0E−18 | 6.3E−19 | 6.4E−19 |
| Average diffusion distance (m) along grain boundary | 1.07E−05 | 1.069E−05 | 1.069E−05 |
| Average reflection coefficient (count) on Ta interface through grain boundary diffusion | 32.3915 | 32.3915 | 32.3915 |
| Surface segregation · surface precipitation probability (—) | 0 | 0 | 0 |
| Interface adsorption ratio (—) | 0.005 | 0 | 0.005 |
| Contribution degree f (—) of grain boundary diffusion to total diffusion quantity | 0.42 | 0.38 | 0.38 |

The [apparent diffusion coefficient in the Cu electrodeposited film] in the Table 1 corresponds to a [diffusion coefficient] according to the present disclosure.

Note that in the Table 1, the [average reflection count of the Ta interface (barrier metal film) through the grain boundary diffusion] is calculated such as [average distance/thickness of electrodeposited copper film/2].

Moreover, the [surface segregation, surface precipitation probability] is assumed to be zero because precipitation quantities of the impurities such as the oxygen, the carbon and the nitrogen contained in the electrodeposited copper film, which are precipitated on the surface, are extremely small even when the electrodeposited copper film is subjected to the thermal treatment in an inactive gas and in vacuum.

<Effect of Evaluation Method>

As discussed above, according to the evaluation method of the semiconductor device of the present disclosure, the semiconductor device including the electrodeposited copper film with the controlled distribution of the impurity concentration is prepared as the sample, the distribution of the impurity concentration before and after the thermal treatment is analyzed based on the secondary ion mass spectrometry (SIMS) by use of this sample, whereby the behavior of the impurity diffusion when the electrodeposited copper film undergoes the thermal treatment can be analyzed and evaluated. The volume diffusion coefficient etc of the electrodeposited copper film, which is obtained from the analyzed result and the evaluated result can be utilized in the case of desiring to, e.g., control the impurity concentration of the electrodeposited copper film grown for the purpose of forming the wiring layer in the semiconductor device. Namely, for instance, the thermal treatment time and the thermal treatment temperature in the case of giving the desired impurity concentration to the electrodeposited copper film can be determined by applying the diffusion coefficient D to the expression C(x, t) given above. The thermal treatment time and the thermal treatment temperature on the occasion of designing, e.g., a semiconductor manufacturing process can be thereby easily determined.

It is known that a difference occurs in the impurity concentration of the electrodeposited copper film due to a change of the composition of the plating solution for electrodeposition and a change of a process condition. Further, it is also known that the impurity concentration of the grown electrodeposited copper film changes when the impurity gets diffused due to a thermal treatment. There is not yet, however, established a technology of analyzing with high accuracy a behavior of the change of the distribution of the impurity concentration due to the thermal treatment such as a diffusion velocity of the impurity, and hence, for example, it is difficult to set the impurity concentration of the copper wiring layer of the semiconductor device to a desired concentration when manufacturing the semiconductor device.

Such being the case, it is an object of the present disclosure to provide a technology of analyzing and evaluating the change of the distribution of the impurity concentration when the electrodeposited copper film is subjected to the thermal treatment.

According to the present disclosure, to accomplish the above object, there is prepared an electrodeposited copper film in which a film of impurity is grown with a predetermined distribution of concentration, and diffusion of the impurity is analyzed and evaluated from a change of the distribution of the impurity concentration of the electrodeposited copper film before and after a thermal treatment. The change of the distribution of the impurity concentration when the electrodeposited copper film is subjected to the thermal treatment can be analyzed and evaluated.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such example in the specification relate to a showing of the superiority and inferiority of the invention. Although the embodiment(s) of the present invention(s) has (have) been described in detail, it should be understood that the various changes, substitutions, and alterations could be made hereto without departing from the spirit and scope of the invention.

What is claimed is:

1. An evaluation method of a semiconductor device, comprising:
    manufacturing a semiconductor device defined as a sample with a copper electrodeposited film grown on a semiconductor substrate, and growing said copper electrodeposited film on said semiconductor substrate by causing a flow of an electric current having an application pattern which transitions to a state of a first current density in which a per-unit-area current density of a deposition current flowing on said semiconductor substrate is a predetermined current density and to a state of a second current density defined as a current density different from the first current density so that a distribution of an impurity concentration in said grown copper electrodeposited film becomes a desired concentration distribution;

analyzing said semiconductor device manufactured and acquiring a distribution of the concentration of the impurity contained in said copper electrodeposited film of said semiconductor device;

thermal treating said semiconductor device;

analyzing said semiconductor device that the distribution of the impurity concentration changed by said thermal treating, and acquiring a distribution of the concentration of the impurity contained in said copper electrodeposited film of said semiconductor device; and comparing the distribution of the impurity concentration acquired by analyzing said semiconductor device before thermal treating with the distribution of the impurity concentration acquired by analyzing said semiconductor device after thermal treating, and analyzing the impurity diffusion on the occasion of the thermal treatment.

2. The evaluation method of a semiconductor device according to claim 1, wherein said analyzing of diffusion includes comparing the distribution of the impurity concentration acquired by analyzing said semiconductor device before thermal treating with the distribution of the impurity concentration acquired by analyzing said semiconductor device after thermal treating, and analyzing a diffusion coefficient defined as a rate of an impurity diffusion velocity to the thermal treatment time on the occasion of the thermal treatment.

3. The evaluation method of a semiconductor device according to claim 2, wherein said analyzing of diffusion includes analyzing the diffusion coefficient based on a relationship between the distribution of the impurity concentration and the thermal treatment time.

4. The evaluation method of a semiconductor device according to claim 1, wherein the second current density is a current density that is equal to or larger than at least twice the first current density.

5. The evaluation method of a semiconductor device according to claim 4, wherein the second current density is a current density that is equal to or larger than at least 5 times the first current density.

6. The evaluation method of a semiconductor device according to claim 1, wherein said copper electrodeposited film of said semiconductor device is grown so that the distribution of the impurity concentration in said copper electrodeposited film becomes the desired concentration distribution by causing the flow of the electric current having an application pattern which transitions to the state of the first current density, to the state of the second current density and, in addition, further to a state of a third current density defined as a current density different from the second current density.

7. The evaluation method of a semiconductor device according to claim 6, wherein the third current density is a current density that is equal to or larger than at least twice the second current density.

8. The evaluation method of a semiconductor device according to claim 7, wherein the third current density is a current density that is equal to or larger than at least 5 times the second current density.

9. The evaluation method of a semiconductor device according to claim 6, wherein the third current density is a current density that is equal to or smaller than at least one-half the second current density.

10. The evaluation method of a semiconductor device according to claim 9, wherein the third current density is a current density that is equal to or smaller than at least one-fifth the second current density.

11. The evaluation method of a semiconductor device according to claim 1, wherein said thermal treating includes thermally treating said semiconductor device at a temperature of 150° C. or higher.

12. The evaluation method of a semiconductor device according to claim 1, wherein said analyzing of impurity concentration include acquiring the distribution of the impurity concentration by use of secondary ion mass spectrometry.

13. The evaluation method of a semiconductor device according to claim 1, wherein said copper electrodeposited film of said semiconductor device is grown by electrodeposition which uses copper sulfate.

14. The evaluation method of a semiconductor device according to claim 1, wherein said copper electrodeposited film of said semiconductor device is grown on a barrier metal film and a seed layer, which are grown on a silicon substrate.

15. The evaluation method of a semiconductor device according to claim 1, wherein said analyzing of the impurity diffusion includes analyzing the impurity diffusion on the occasion of the thermal treatment on the basis of Random walk model.

16. The evaluation method of a semiconductor device according to claim 15, wherein said analyzing of the impurity diffusion includes analyzing the impurity diffusion on the occasion of the thermal treatment on the basis of Random walk model, and analyzing the distribution of the impurity diffusion after incorporating an adsorption ratio of the impurity of the barrier metal.

17. The evaluation method of a semiconductor device according to claim 1, further comprising designing a semiconductor manufacturing process based on a thermal treatment time and a thermal treatment temperature that are determined based on the analyzed result of the behavior of the impurity diffusion.

* * * * *